US011424749B1

(12) United States Patent
Chieh et al.

(10) Patent No.: US 11,424,749 B1
(45) Date of Patent: Aug. 23, 2022

(54) ANALOG LOCK DETECTOR FOR A PHASE LOCK LOOP

(71) Applicant: The United States of America, as represented by the Secretary of the Navy, San Diego, CA (US)

(72) Inventors: Jia-Chi Samuel Chieh, San Diego, CA (US); Henry D. Ngo, San Diego, CA (US)

(73) Assignee: United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 17/560,854

(22) Filed: Dec. 23, 2021

(51) Int. Cl.
*H03L 7/095* (2006.01)
*H03L 7/099* (2006.01)
*H03L 7/089* (2006.01)

(52) U.S. Cl.
CPC .............. *H03L 7/095* (2013.01); *H03L 7/099* (2013.01); *H03L 7/0891* (2013.01)

(58) Field of Classification Search
CPC ........ H03L 7/095; H03L 7/099; H03L 7/0891
See application file for complete search history.

(56) References Cited

U.S. PATENT DOCUMENTS

| | | | | |
|---|---|---|---|---|
| 5,212,817 A | * | 5/1993 | Atkinson | H03J 1/0091 455/164.2 |
| 5,956,379 A | * | 9/1999 | Tarleton | H03L 7/095 331/25 |
| 6,249,189 B1 | * | 6/2001 | Wu | H03L 7/1075 327/107 |
| 6,392,456 B1 | * | 5/2002 | Pyeon | H03L 7/0816 331/DIG. 2 |
| 6,448,862 B1 | * | 9/2002 | Yoder | H03K 3/03 331/34 |

(Continued)

FOREIGN PATENT DOCUMENTS

CN 111211769 A * 5/2020

OTHER PUBLICATIONS

Lock Detect on the ADF4xxx Family of PLL Synthesizers. Application Note AN-873 [online]. Analog Devices, 2006 [retrieved on Dec. 23, 2021]. Retrieved from Internet: <URL: https://www.analog.com/media/en/technical-documentation/application-notes/AN-873.pdf>.

*Primary Examiner* — Adam D Houston
(74) *Attorney, Agent, or Firm* — Naval Information Warfare Center, Pacific; Kyle Eppele; James McGee

(57) ABSTRACT

An analog lock detector for a phase lock loop includes a detector, a logic gate, a delay circuit, and a guard gate inverter. The detector outputs up and down signals relating synthesized and reference frequencies. The logic gate outputs an initial lock signal combining the up and down signals. While the synthesized and reference frequencies are locked, the initial lock signal has a steady state except during brief intervals. The delay circuit outputs a delayed lock signal that time delays the initial lock signal by a delay amount, which matches a maximum allowed duration of the brief intervals while locked. A guard gate inverter outputs a final lock signal that combines the initial lock signal and the delayed lock signal. The final lock signal has the steady state indicating when the synthesized frequency is locked to the reference frequency, but without the brief intervals of deviation from the steady state.

20 Claims, 3 Drawing Sheets

(56) References Cited

U.S. PATENT DOCUMENTS

| | | | | |
|---|---|---|---|---|
| 6,696,874 | B2* | 2/2004 | Wood | H03K 3/35625 |
| | | | | 327/210 |
| 6,744,323 | B1* | 6/2004 | Moyal | H03L 7/104 |
| | | | | 331/DIG. 2 |
| 9,831,882 | B1* | 11/2017 | Chen | H03L 7/087 |
| 10,848,134 | B2* | 11/2020 | Gill | H03K 3/356104 |
| RE48,735 | E * | 9/2021 | Ranganathan | H03K 3/033 |
| 11,115,008 | B2* | 9/2021 | Maru | H03K 3/0375 |
| 11,271,566 | B2* | 3/2022 | Korol | H03K 19/09403 |
| 2006/0119410 | A1* | 6/2006 | Carlson | H03K 19/00338 |
| | | | | 327/310 |
| 2009/0102581 | A1* | 4/2009 | Drost | H03K 3/0315 |
| | | | | 333/24 C |
| 2012/0119780 | A1* | 5/2012 | Dumitru | G01R 31/31816 |
| | | | | 326/16 |
| 2012/0274352 | A1* | 11/2012 | Dumitru | G01R 31/31816 |
| | | | | 326/16 |
| 2012/0319883 | A1* | 12/2012 | Cao | G04F 10/005 |
| | | | | 341/155 |
| 2014/0091628 | A1* | 4/2014 | Thompson | H02J 3/385 |
| | | | | 307/66 |
| 2019/0356324 | A1* | 11/2019 | Jenkins | H03L 7/1972 |
| 2022/0099794 | A1* | 3/2022 | Falkenberg | G01S 13/06 |

* cited by examiner

ANALOG LOCK DETECTOR FOR A PHASE LOCK LOOP

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 113137.

BACKGROUND OF THE INVENTION

A phase lock loop (PLL) is a typically radio frequency circuit used to generate periodic signals at various frequencies. A PLL is often known as a clock reference, a clock generator, or a frequency synthesizer. A PLL typically takes some time to reach equilibrium and acquire frequency lock. This is known as the acquisition time. Typically, a PLL includes a digital lock detector providing a lock indicator signal, which indicates the PLL has locked in frequency and provides as a stable periodic signal. The lock indicator signal from a digital lock detector has no ripple when locked. There is a general need for a lock detector for a PLL that is simple to use.

SUMMARY

An analog lock detector for a phase lock loop includes a detector, a logic gate, a delay circuit, and a guard gate inverter. The detector outputs up and down signals relating synthesized and reference frequencies. The logic gate outputs an initial lock signal combining the up and down signals. While the synthesized and reference frequencies are locked, the initial lock signal has a steady state except during brief intervals. The delay circuit outputs a delayed lock signal that time delays the initial lock signal by a delay amount, which matches a maximum allowed duration of the brief intervals while locked. A guard gate inverter outputs a final lock signal that combines the initial lock signal and the delayed lock signal. The final lock signal has the steady state indicating when the synthesized frequency is locked to the reference frequency, but without the brief intervals of deviation from the steady state.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed systems and methods below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Embodiments of the invention provide an analog lock detector for a phase lock loop that is simple and readily usable. Despite being analog, the final lock signal has no ripple when locked. In one embodiment, the analog lock detector includes merely eighteen transistors. Thus, embodiments of the invention reduce complexity by eliminating the digital lock detector having more transistors, while still producing a lock indication signal with no ripple when locked.

Figure 1:
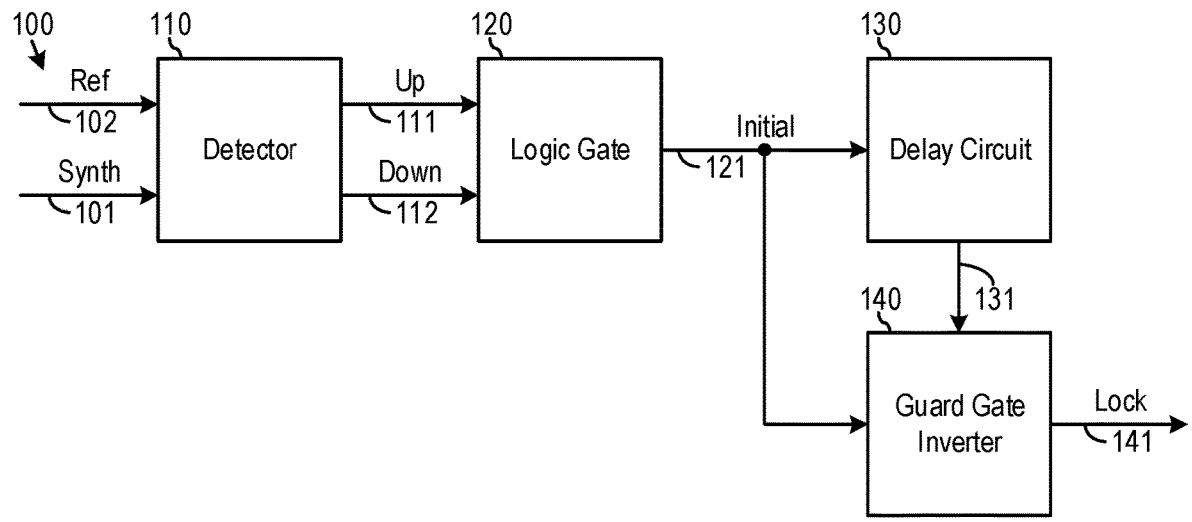
FIG. 1 is a block diagram of an analog lock detector for a phase lock loop in accordance with an embodiment of the invention.

FIG. 1 is a block diagram of an analog lock detector 100 for a phase lock loop in accordance with an embodiment of the invention.

A detector 110 outputs an up signal on line 111 and a down signal on line 112. The up signal on line 111 indicates a synthesized frequency on line 101 generated within the phase lock loop is less than a reference frequency on line 102. The down signal on line 112 indicates the synthesized frequency on line 101 is greater than the reference frequency on line 102.

A logic gate 120 outputs an initial lock signal on line 121 that combines the up and down signals on lines 111 and 112. While the synthesized frequency on line 101 is locked to the reference frequency on line 102, the initial lock signal on line 121 has a steady state except during a plurality of brief intervals when the up signal on line 111 indicates the synthesized frequency on line 101 is slightly less than the reference frequency on line 102 and/or the down signal on line 112 indicates the synthesized frequency on line 101 is slightly greater than the reference frequency on line 102.

A delay circuit 130 outputs a delayed lock signal on line 131 that time delays the initial lock signal on line 121 by a delay amount, which matches a maximum allowed duration of the brief intervals while the synthesized frequency on line 101 is locked to the reference frequency on line 102.

A guard gate inverter 140 outputs a final lock signal on line 141 that combines the initial lock signal on line 121 and the delayed lock signal on line 131. The final lock signal on line 141 of the analog lock detector 100 has the steady state indicating when the synthesized frequency on line 101 is locked to the reference frequency on line 102, but without the brief intervals of deviation from the steady state.

Figure 2:
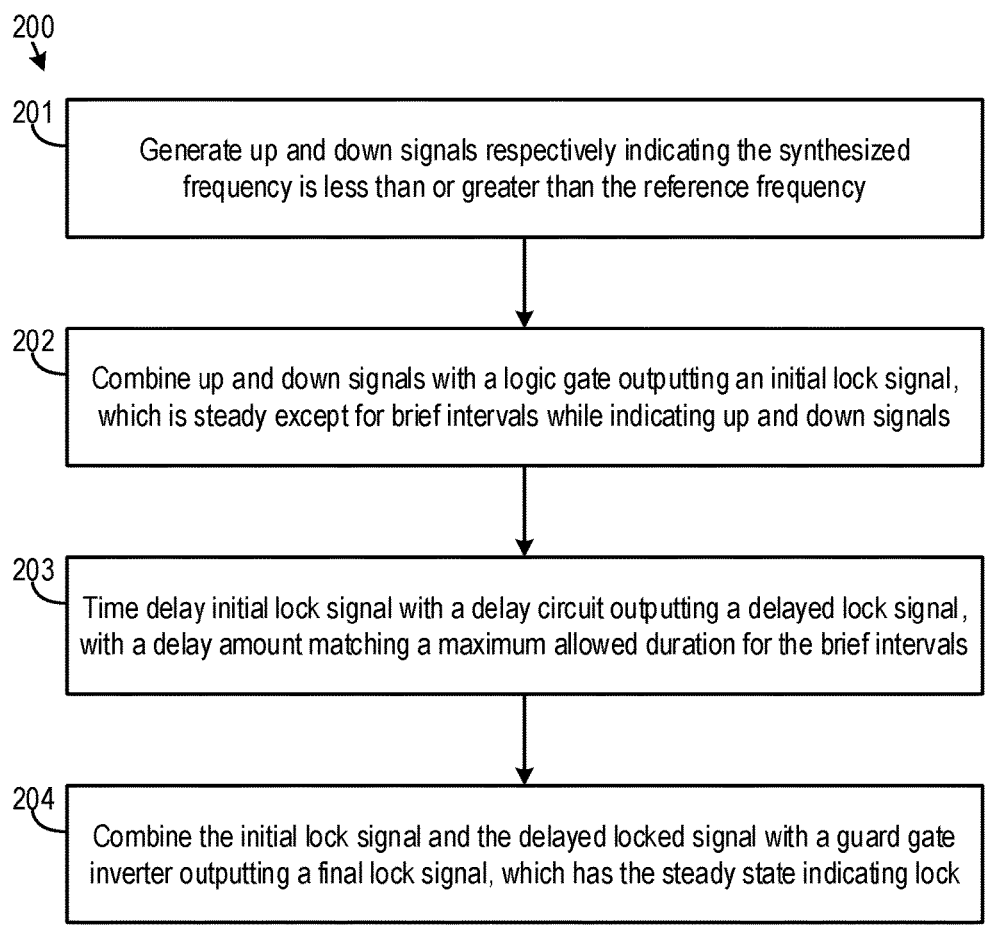
FIG. 2 is a flow diagram of process for detecting lock of a phase lock loop in accordance with an embodiment of the invention.

FIG. 2 is a flow diagram of process 200 for detecting lock of a phase lock loop in accordance with an embodiment of the invention.

Step 201 generates an up signal and a down signal, the up signal indicating a synthesized frequency generated within the phase lock loop is less than a reference frequency, and the down signal indicating the synthesized frequency is greater than the reference frequency.

Step 202 combines the up and down signals with a logic gate that outputs an initial lock signal. While the synthesized frequency is locked to the reference frequency, the initial lock signal has a steady state except during a plurality of brief intervals when the up signal indicates the synthesized frequency is slightly less than the reference frequency and/or the down signal indicates the synthesized frequency is slightly greater than the reference frequency.

Step 203 time delays the initial lock signal by a delay amount with a delay circuit that outputs a delayed lock signal. The delay amount matches a maximum allowed duration of the brief intervals while the synthesized frequency is locked to the reference frequency.

Step 204 combines the initial lock signal and the delayed lock signal with a guard gate inverter that outputs a final lock signal. The final lock signal has the steady state indicating when the synthesized frequency is locked to the reference frequency, but without the brief intervals of deviation from the steady state.

Figure 3:
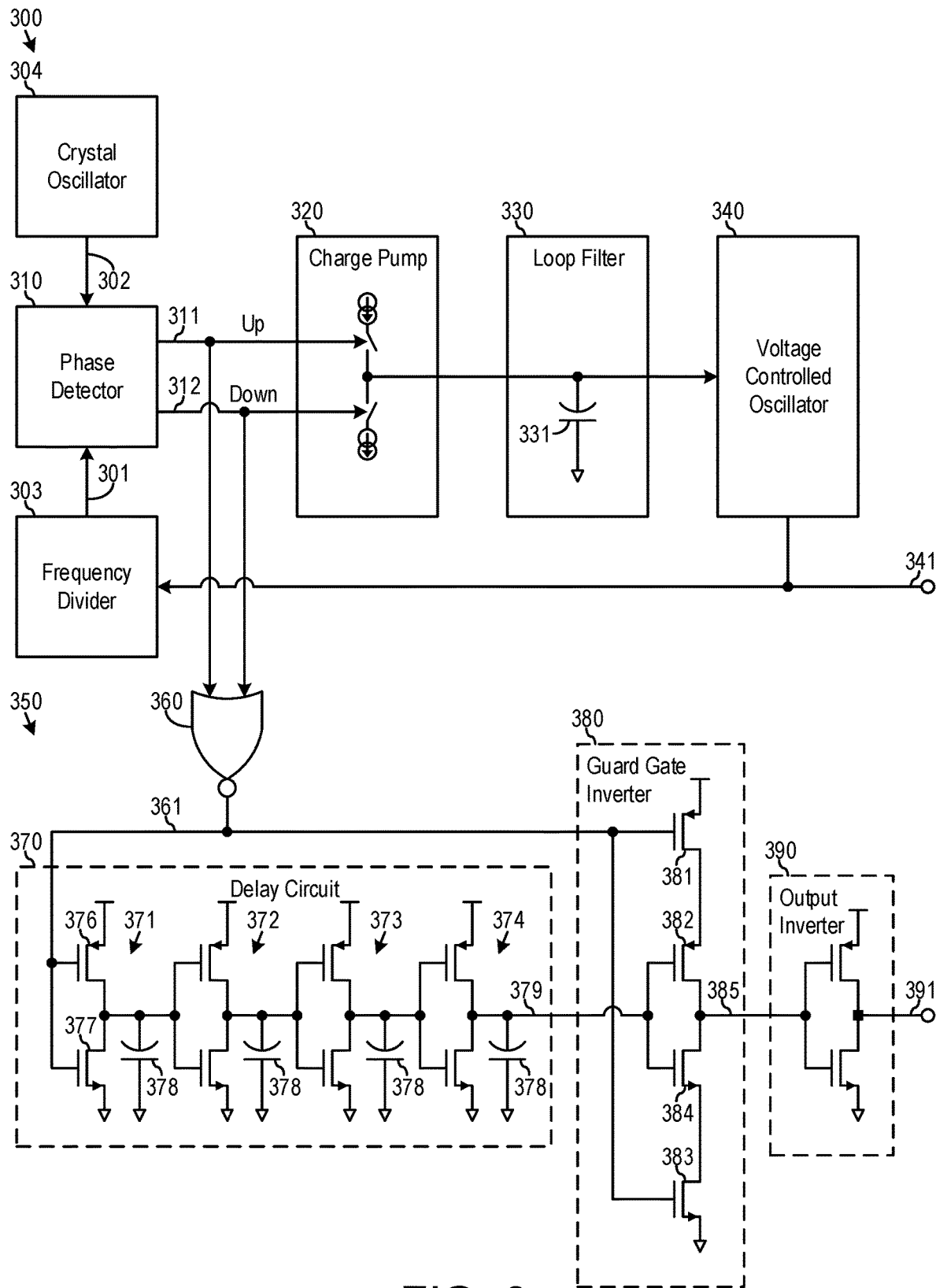
FIG. 3 is a block diagram of a phase lock loop with an analog lock detector in accordance with an embodiment of the invention.

FIG. 3 is a block diagram of a phase lock loop 300 with an analog lock detector 350 in accordance with an embodiment of the invention.

The phase lock loop 300 includes a crystal oscillator 304, a phase detector 310, a charge pump 320, a loop filter 330, and a voltage-controlled oscillator 340. The crystal oscillator 304 generates the reference frequency on line 302. The phase detector 310 outputs the up and down signals on lines 311 and 312. The charge pump 320 incrementally charges a loop capacitor 331 when the up signal on line 311 indicates the synthesized frequency on line 301 is less than the reference frequency on line 302, and incrementally discharges the loop capacitor 331 when the down signal on line 312 indicates the synthesized frequency on line 301 is greater than the reference frequency on line 302. The loop filter 330 includes the loop capacitor 331. The voltage-controlled oscillator 340 generates an output synthesized frequency on line 341 as a monotonic function of a voltage on the loop capacitor 331.

The phase lock loop 300 further includes a frequency divider 303. The frequency divider 303 outputs a feedback synthesized frequency on line 301, which divides the output synthesized frequency on line 341 by an integer factor. Thus, the voltage-controlled oscillator 340 directly generates the output synthesized frequency on line 341 and indirectly generates the feedback synthesized frequency on line 301 via the frequency divider 303. While the feedback synthesized frequency on line 301 is locked to the reference frequency on line 302, the output synthesized frequency on line 341 is also locked to the reference frequency on line 302 with the output synthesized frequency on line 341 equaling the reference frequency on line 302 multiplied by the integer factor of frequency divider 303.

Another embodiment has a second frequency divider between the crystal oscillator 304 and the phase detector 310, such that the output synthesized frequency on line 341 equals the crystal oscillator's reference frequency on line 302 multiplied by a ratio of integer factors.

For example, the crystal oscillator crystal oscillator 304 is ultra-stable frequency source generating the reference frequency on line 302 at typically at some lower frequency, such as 10 MHz, than the desired synthesized frequency on line 341, such as 1.28 GHz. The voltage controlled oscillator 340 can oscillate at 1.28 GHz, but is not stable and shifts frequency when free running. Thus, a feedback loop is necessary to lock in the output synthesized frequency on line 341 from the voltage controlled oscillator 340. The frequency divider 303 divides the output synthesized frequency on line 341 by some integer value N. In this example, N is 128. With the voltage controlled oscillator 340 running natively at 1.28 GHz, and then undergoing a division by 128 in frequency divider 303, the feedback synthesized frequency on line 301 becomes 10 MHz. Phase detector 310 compares this 10 MHz signal of the feedback synthesized frequency on line 301 with the 10 MHz signal of the output synthesized frequency on line 341 from the voltage controlled oscillator 340.

In the embodiment of FIG. 3, the logic gate 120 of FIG. 1 is a NOR gate 360 outputting the initial lock signal on line 361 that combines the up and down signals on lines 311 and 312. The up and down signals on lines 311 and 312 are positive logic signals respectively indicating the synthesized frequency on line 301 is slightly less than or slightly greater than the reference frequency on line 302. The initial lock signal on line 361 is a positive logic signal having, except during the brief intervals, a steady state at a high level indicating when the synthesized frequency on line 301 is locked to the reference frequency on line 302.

A delay circuit 370 includes an even number of inverters 371, 372, 373, and 374 connected in series between the initial lock signal on line 361 and a delayed lock signal on line 379 at the guard gate inverter 380. From the initial lock signal on line 361, the inverters 371, 372, 373, and 374 generate the delayed lock signal on line 379 that time delays the initial lock signal on line 361 by a delay amount. The delay amount includes a propagation delay through each of the inverters 371, 372, 373, and 374.

Each of the inverters 371, 372, 373, and 374 includes a PMOS transistor 376 and an NMOS transistor 377, with a channel length of the PMOS transistor 376 being at least twice a minimum channel length of a PMOS transistor and a channel length of the NMOS transistor 377 being at least four times a minimum channel length of a NMOS transistor to increase the resistance R of the each of the inverters 371, 372, 373, and 374 above a resistance of a minimum-sized inverter. The delay circuit further 370 includes one or more optional capacitors 378, each connected to a node between adjacent ones of the inverters 371, 372, 373, and 374 connected in the series or between the final inverter 374 in the series and a guard gate inverter 380. The delay amount further includes an RC delay from charging and/or discharging each included capacitor 378 with a capacitance C through a resistance R of a respective one of the inverters 371, 372, 373, or 374.

The guard gate inverter 380 includes a first and second transistor 381 and 382 connected in series between a positive power supply and the final lock signal on line 385. The first transistor 381 is controlled by the initial lock signal on line 361 and the second transistor 382 is controlled by the delayed lock signal on line 379. The first and second transistors 381 and 382 are each a PMOS transistor connected in series in this order between the positive power supply and the final lock signal on line 385. A gate electrode of the first transistor 381 is connected to the initial lock signal on line 361 and a gate electrode of the second transistor 382 is connected to the delayed lock signal on line 379.

The guard gate inverter 380 further includes a third and fourth transistor 383 and 384 connected in series between a negative power supply and the final lock signal on line 385. The third transistor 383 is controlled by the initial lock signal on line 361 and the fourth transistor 384 is controlled by the delayed lock signal on line 379. The third and fourth transistors 383 and 384 are each an NMOS transistor connected in series in this order between the negative power supply at ground and the final lock signal on line 385. A gate electrode of the third transistor 383 is connected to the initial lock signal on line 361 and a gate electrode of the fourth transistor 384 is connected to the delayed lock signal on line 379.

An optional output inverter 390 is disposed proximate the guard gate inverter 380. The optional output inverter 390 converts the final lock signal on line 385, which is a negative logic signal having a low level when locked, into the final lock signal on line 391, which is a positive logic signal having a high level when locked. The optional output inverter 390 amplifies the final lock signal on line 385 from the guard gate inverter 380. The optional output inverter 390 has an input capacitance that holds the final lock signal on line 385 at the steady state during each of the brief and delayed intervals when the final lock signal on line 385 floats decoupled from both the positive power supply and the negative power supply.

Figure 4A:
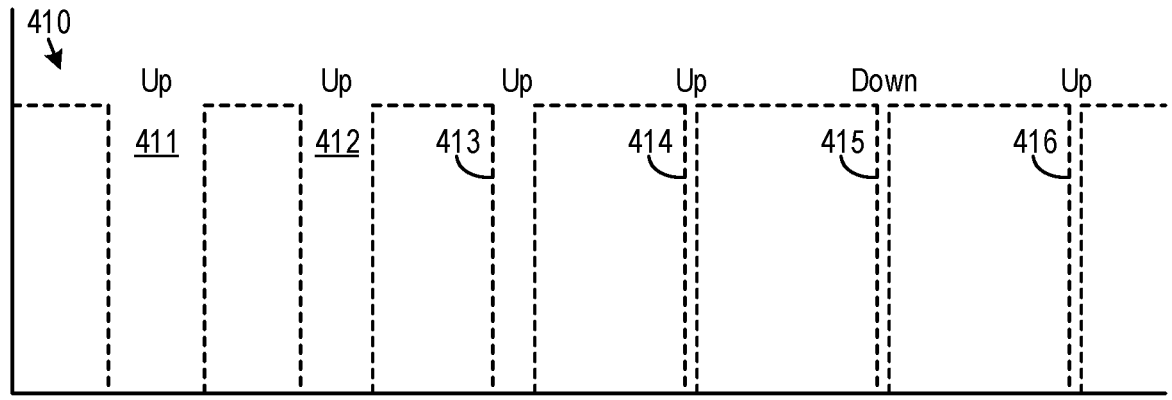
FIG. 4A-C are waveforms of an analog lock detector for a phase lock loop in accordance with an embodiment of the invention.
Figure 4B:
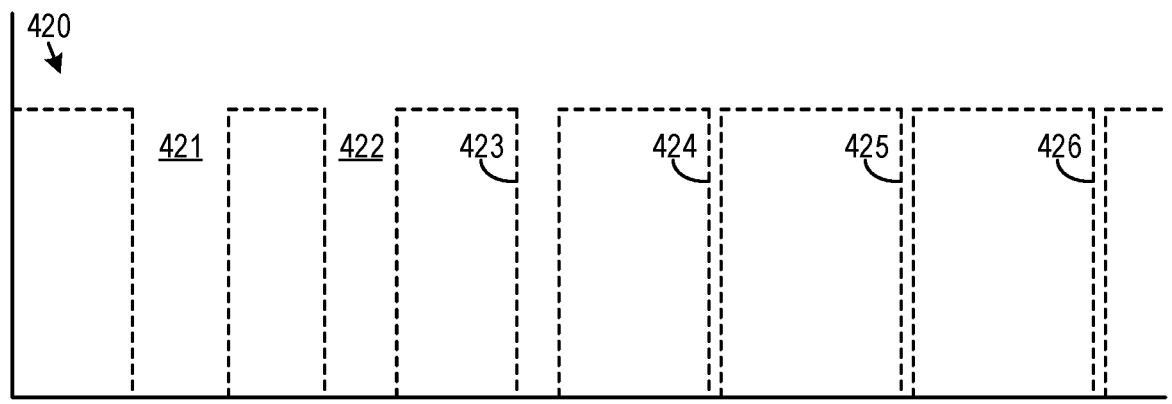
Figure 4C:
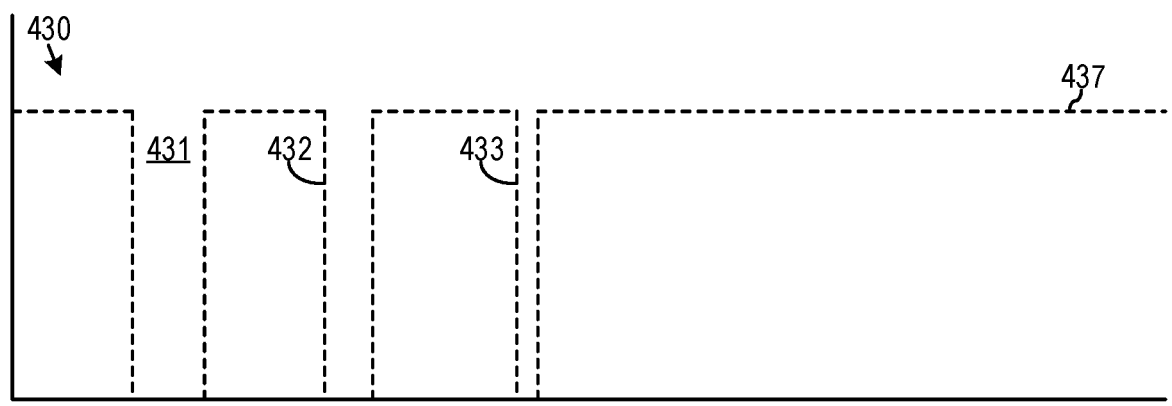

FIG. 4A-C are waveforms 410, 420, and 430 of an analog lock detector for a phase lock loop in accordance with an embodiment of the invention. The waveforms 410, 420, and 430 illustrate a simplified example for discussion purposes of the operation of the analog lock detector 350 for the phase lock loop 300 of FIG. 3.

Waveform 410 of FIG. 4A shows the initial lock signal on line 361 while the phase lock loop 300 is achieving lock between the synthesized frequency on line 301 and the reference frequency on line 302. At negative pulse 411, the synthesized frequency on line 301 has a phase behind the reference frequency on line 302, typically indicating the synthesized frequency on line 301 is less than the reference frequency on line 302. Thus, the phase detector 310 outputs a positive pulse on the up signal on line 311 that becomes the negative pulse 411 of the initial lock signal on line 361. At successively shorter pulses 412 and 413, the synthesized frequency on line 301 becomes closer in frequency and phase to the reference frequency on line 302.

At brief pulse 414, lock is achieved between the synthesized frequency on line 301 and the reference frequency on line 302. The brevity of brief pulses 414, 415, and 416 indicates lock is achieved between the synthesized frequency on line 301 and the reference frequency on line 302. At brief pulse 415, the synthesized frequency on line 301 slightly overshoots the reference frequency on line 302, so the phase detector 310 outputs a pulse on the down signal on line 312 that becomes pulse 415. Typically, after lock is achieved, the phase detector 310 intermixes alternating or more complex patterns of pulses on the up and down signals on lines 311 and 312.

For discussion purposes, the phase lock loop 300 generates mutually exclusive up and down signals on lines 311 and 312. More typically in another embodiment, pulses of the up signal on line 311 overlap with pulses of the down signal on line 312, but the relative durations of these pulses determine whether the charge pump 320 incrementally charges or incrementally discharges the loop capacitor 331.

Waveform 420 of FIG. 4B shows the delayed lock signal on line 379. The delay circuit 370 generates the delayed lock signal on line 379 that time delays the initial lock signal on line 361 by a delay amount. Thus, the pulses 411, 412, 413, 414, 415, and 416 of the waveform 410 of the initial lock signal on line 361 are repeated as delayed pulses 421, 422, 423, 424, 425, and 426 of the waveform 420 of the delayed lock signal on line 379.

Waveform 430 of FIG. 4C shows the final lock signal on line 391. The final lock signal on line 391 is a positive logic signal with a steady state 437 at a high level when the phase lock loop 300 is locked. The negative pulses 431, 432, and 433 initially indicate the phase lock loop 300 is not yet locked.

After lock is achieved and during each of the brief intervals of pulses 414, 415, and 416 of the initial lock signal on line 361, the low level of the initial lock signal on line 361 turns off the third transistor 383 to decouple the final lock signal on line 385 from the negative power supply, and the concurrent high level of the delayed lock signal on line 379 keeps off the second transistor 382 to decouple the final lock signal on line 385 from the positive power supply. During each of the delayed intervals of pulses 424, 425, and 426 of the delayed lock signal on line 379, the low level of the delayed lock signal on line 379 turns off the fourth transistor 384 to decouple the final lock signal on line 385 from the negative power supply, and the concurrent high level of initial lock signal on line 361 keeps off the first transistor 381 to decouple the final lock signal on line 385 from the positive power supply. In summary, because the initial lock signal on line 361 and the delayed lock signal on line 379 have different levels during the brief intervals of pulses 414, 415, and 416 of the initial lock signal on line 361 and during the delayed intervals of pulses 424, 425, and 426 of the delayed lock signal on line 379, the final lock signal on line 385 floats decoupled from both the positive and negative power supplies during brief pulses 414, 415, and 416 and brief pulses 424, 425, and 426.

The delay amount of the delay circuit 370 sets a maximum allowed duration while the synthesized frequency on line 301 is locked to the reference frequency line 302. Because each of the brief intervals of pulses 414, 415, and 416 of the initial lock signal on line 361 has a duration less than the maximum allowed duration, the brief intervals of pulses 414, 415, and 416 and the delayed intervals of pulses 424, 425, and 426 never overlap. In addition, during each of the brief intervals of pulses 414, 415, and 416 and during each of the delayed intervals of pulses 424, 425, and 426, the final lock signal on line 385 is decoupled from both the positive power supply and the negative power supply so that the final lock signal on line 385 floats at a steady state, which the output inverter 390 converts from negative logic into positive logic of steady state 437 of the final lock signal on line 391.

This locked steady state 437 of the final lock signal on line 391 is set outside the brief and delayed intervals by the output inverter 390 in response to the final lock signal on line 385. The corresponding steady state of the final lock signal on line 385 is set outside the brief and delayed intervals to the negative power supply by the third and fourth transistors 383 and 384 because the final lock signal on line 385 is a negative logic signal. In another embodiment where the final lock signal on line 385 is a positive logic signal, the first and second transistors 381 and 382 set the final lock signal on line 385 to the positive power supply.

When the synthesized frequency on line 301 is not locked to the reference frequency on line 302, the initial lock signal on line 361 deviates from the steady state during each not-so-brief interval of pulses 411, 412, and 413 with a duration greater than the maximum allowed duration. Each interval of pulses 411, 412, and 413 has an overlap with a corresponding not-so-brief interval of pulses 421, 422, and 423 of the delayed lock signal on line 379 from the delay circuit 370 delaying the initial lock signal on line 361 by the delay amount matching the maximum allowed duration. During the overlap between the not-so-brief interval of each of pulses 411, 412, and 413 and the corresponding not-so-brief interval of pulses 421, 422, and 423, the final lock signal on line 391 deviates from the steady state 437 at negative pulses 431, 432, and 433 to indicate the synthesized frequency on line 301 is not locked to the reference frequency on line 302. During the overlap, the first and second transistors 381 and 382 set the final lock signal on line 385 to the positive power supply. In another embodiment where the final lock signal on line 385 is a positive logic signal, the third and fourth transistors 383 and 384 set the final lock signal on line 385 to the negative power supply.

Thus, the final lock signal on line 391 of the analog lock detector 350 has the steady state 437 indicating when the synthesized frequency on line 301 is locked to the reference frequency on line 302, but without the brief intervals of deviation of pulses 414, 415, and 416 from the corresponding steady state of the initial lock signal on line 361.

In an example implementation, while synthesized frequency on line 301 is locked to the reference frequency on line 302, the brief intervals of pulses 414, 415, and 416 of the initial lock signal on line 361 have a duration of 0.2 to 0.5 nanosecond each, a periodicity matching a period of the reference frequency on line 302, and a duty cycle of less than five percent. The delay amount of the delay circuit is two nanoseconds in this example implementation.

As shown in the embodiment of FIG. 3, because the two-input NOR gate 360 is typically implemented with four transistors, the logic gate of the NOR gate 360, the delay circuit 370, the guard gate inverter 380, and the output inverter 390 together include at most eighteen transistors to implement the analog lock detector 350.

From the above description of the Analog Lock Detector for a Phase Lock Loop, it is manifest that various techniques may be used for implementing the concepts of systems 100 and 300 and method 200 without departing from the scope of the claims. The described embodiments are to be considered in all respects as illustrative and not restrictive. The systems or methods disclosed herein may be practiced in the absence of any element that is not specifically claimed and/or disclosed herein. It should also be understood that system 100 or 300 or method 200 is not limited to the particular embodiments described herein, but is capable of many embodiments without departing from the scope of the claims.

We claim:

1. An analog lock detector for a phase lock loop, comprising:
    a detector outputting an up signal and a down signal, the up signal for indicating a synthesized frequency generated within the phase lock loop is less than a reference frequency, and the down signal for indicating the synthesized frequency is greater than the reference frequency;
    a logic gate outputting an initial lock signal that combines the up and down signals, wherein while the synthesized frequency is locked to the reference frequency, the initial lock signal has a steady state except during a plurality of brief intervals when the up signal indicates the synthesized frequency is slightly less than the reference frequency and/or the down signal indicates the synthesized frequency is slightly greater than the reference frequency;
    a delay circuit outputting a delayed lock signal that time delays the initial lock signal by a delay amount, which matches a maximum allowed duration of the brief intervals while the synthesized frequency is locked to the reference frequency; and
    a guard gate inverter outputting a final lock signal that combines the initial lock signal and the delayed lock signal, the final lock signal of the analog lock detector having the steady state indicating when the synthesized frequency is locked to the reference frequency, but without the brief intervals of deviation from the steady state.

2. The analog lock detector of claim 1, wherein the guard gate inverter includes:
    a first and second transistor connected in series between a positive power supply and the final lock signal, the first transistor controlled by the initial lock signal and the second transistor controlled by the delayed lock signal; and
    a third and fourth transistor connected in series between a negative power supply and the final lock signal, the third transistor controlled by the initial lock signal and the fourth transistor controlled by the delayed lock signal.

3. The analog lock detector of claim 2, wherein:
    the first and second transistors are each a PMOS transistor connected in series in this order between the positive power supply and the final lock signal, a gate electrode of the first transistor connected to the initial lock signal and a gate electrode of the second transistor connected to the delayed lock signal; and
    the third and fourth transistors are each an NMOS transistor connected in series in this order between the negative power supply at ground and the final lock signal, a gate electrode of the third transistor connected to the initial lock signal and a gate electrode of the fourth transistor connected to the delayed lock signal.

4. The analog lock detector of claim 2, wherein:
    during each of the brief intervals of the initial lock signal, the second transistor remains off to decouple the final lock signal from the positive power supply and the third transistor turns off to decouple the final lock signal from the negative power supply; and
    during each of a plurality of delayed intervals of the delayed lock signal corresponding to the brief intervals of the initial lock signal delayed in the delay circuit by the delay amount, the first transistor remains off to decouple the final lock signal from the positive power supply, and the fourth transistor turns off to decouple the final lock signal from the negative power supply.

5. The analog lock detector of claim 4, wherein because each of the brief intervals of the initial lock signal has a duration less than the maximum allowed duration so that the brief intervals and the delayed intervals never overlap while the synthesized frequency is locked to the reference frequency, during each of the brief and delayed intervals the final lock signal is decoupled from both the positive power supply and the negative power supply so that the final lock signal floats at the steady state, which is set outside the brief and delayed intervals either to the positive power supply by the first and second transistors when the final lock signal is a positive logic signal or to the negative power supply by the third and fourth transistors when the final lock signal is a negative logic signal.

6. The analog lock detector of claim 5, wherein
    when the synthesized frequency is not locked to the reference frequency, the initial lock signal deviates from the steady state during at least one not-so-brief interval with a duration greater than the maximum allowed duration;
    the not-so-brief interval has an overlap with a corresponding not-so-brief interval of the delayed lock signal from the delay circuit delaying the initial lock signal by the delay amount matching the maximum allowed duration; and
    during the overlap between the not-so-brief interval and the corresponding not-so-brief interval, the final lock signal deviates from the steady state to indicate the synthesized frequency is not locked to the reference frequency, with the third and fourth transistors setting the final lock signal to the negative power supply when the final lock signal is the positive logic signal, and with the first and second transistors setting the final lock signal to the positive power supply when the final lock signal is the negative logic signal.

7. The analog lock detector of claim 5, further comprising an output inverter disposed proximate the guard gate inverter, the output inverter amplifying the final lock signal from the guard gate inverter with the output inverter having an input capacitance that holds the final lock signal at the steady state during each of the brief and delayed intervals when the final lock signal floats decoupled from both the positive power supply and the negative power supply.

8. The analog lock detector of claim 7, wherein the logic gate, the delay circuit, the guard gate inverter, and the output inverter together include at most eighteen transistors.

9. The analog lock detector of claim 7, wherein:
the logic gate is a NOR gate outputting the initial lock signal that combines the up and down signals, which respectively indicate the synthesized frequency is slightly less than or slightly greater than the reference frequency, the initial lock signal having, except during the brief intervals, the steady state indicating when the synthesized frequency is locked to the reference frequency; and
the delay circuit includes an even number of inverters connected in series between the initial lock signal and the delayed lock signal at the guard gate inverter, from the initial lock signal the inverters generating the delayed lock signal that time delays the initial lock signal by the delay amount, which includes a propagation delay through each of the inverters.

10. The analog lock detector of claim 1, wherein:
the logic gate is a NOR gate outputting the initial lock signal that combines the up and down signals, which are positive logic signals respectively indicating the synthesized frequency is slightly less than or slightly greater than the reference frequency; and
the initial lock signal is a positive logic signal having, except during the brief intervals, the steady state indicating the synthesized frequency is locked to the reference frequency.

11. The analog lock detector of claim 1, wherein the delay circuit includes an even number of inverters connected in series between the initial lock signal and the delayed lock signal at the guard gate inverter, from the initial lock signal the inverters generating the delayed lock signal that time delays the initial lock signal by the delay amount, which includes a propagation delay through each of the inverters.

12. The analog lock detector of claim 11, wherein the delay circuit further includes at least one capacitor, each connected to a node between adjacent ones of the inverters connected in the series or between a final one of the inverters in the series and the guard gate inverter, the delay amount further including an RC delay from charging and/or discharging the capacitor with a capacitance C through a resistance R of a respective one of the inverters.

13. The analog lock detector of claim 12, wherein the guard gate inverter includes:
a first and second transistor connected in series between a positive power supply and the final lock signal, the first transistor controlled by the initial lock signal and the second transistor controlled by the delayed lock signal; and
a third and fourth transistor connected in series between a negative power supply and the final lock signal, the third transistor controlled by the initial lock signal and the fourth transistor controlled by the delayed lock signal.

14. The analog lock detector of claim 12, wherein each invertor of the inverters includes a PMOS transistor and an NMOS transistor, with a channel length of the PMOS transistor being at least twice a minimum channel length of the PMOS transistor and a channel length of the NMOS transistor being at least four times a minimum channel length of the NMOS transistor to increase the resistance R of the inverter above a resistance of a minimum-sized inverter.

15. The analog lock detector of claim 12, wherein while the synthesized frequency is locked to the reference frequency, the brief intervals of the initial lock signal have a duration of 0.2 to 0.5 nanosecond each, a periodicity matching a period of the reference frequency, and a duty cycle of less than five percent.

16. The analog lock detector of claim 15, wherein the delay amount of the delay circuit is two nanoseconds.

17. The analog lock detector of claim 1, further comprising the phase lock loop including:
the detector that is a phase detector outputting the up and down signals;
a charge pump for incrementally charging a loop capacitor when the up signal indicates the synthesized frequency is less than the reference frequency, and for incrementally discharging the loop capacitor when the down signal indicates the synthesized frequency is greater than the reference frequency;
a loop filter including the loop capacitor; and
a voltage-controlled oscillator for generating the synthesized frequency as a monotonic function of a voltage on the loop capacitor.

18. The analog lock detector of claim 17, the phase lock loop further including:
a frequency divider outputting the synthesized frequency that is a feedback synthesized frequency, which divides an output synthesized frequency by an integer factor,
wherein the voltage-controlled oscillator directly generates the output synthesized frequency and indirectly generates the feedback synthesized frequency via the frequency divider, and while the feedback synthesized frequency is locked to the reference frequency, the output synthesized frequency is also locked to the reference frequency with the output synthesized frequency equaling the reference frequency multiplied by the integer factor.

19. The analog lock detector of claim 18, further comprising a crystal oscillator for generating the reference frequency.

20. A method for detecting lock of a phase lock loop, comprising:
generating an up signal and a down signal, the up signal indicating a synthesized frequency generated within the phase lock loop is less than a reference frequency, and the down signal indicating the synthesized frequency is greater than the reference frequency;
combining the up and down signals with a logic gate that outputs an initial lock signal, wherein while the synthesized frequency is locked to the reference frequency, the initial lock signal has a steady state except during a plurality of brief intervals when the up signal indicates the synthesized frequency is slightly less than the reference frequency and/or the down signal indicates the synthesized frequency is slightly greater than the reference frequency;

time delaying the initial lock signal by a delay amount with a delay circuit that outputs a delayed lock signal, the delay amount matching a maximum allowed duration of the brief intervals while the synthesized frequency is locked to the reference frequency; and
combining the initial lock signal and the delayed lock signal with a guard gate inverter that outputs a final lock signal, which has the steady state indicating when the synthesized frequency is locked to the reference frequency, but without the brief intervals of deviation from the steady state.

\* \* \* \* \*